(12) United States Patent
Murdock et al.

(10) Patent No.: US 10,015,882 B1
(45) Date of Patent: Jul. 3, 2018

(54) MODULAR SEMICONDUCTOR PACKAGE

(71) Applicant: TriQuint Semiconductor, Inc., Hillsboro, OR (US)

(72) Inventors: Dylan Murdock, Allen, TX (US); Binh K. Le, Frisco, TX (US); Michael J. Arnold, Westminster, TX (US); Walid Meliane, Frisco, TX (US)

(73) Assignee: Qorvo US, Inc., Greensboro, NC (US)

( * ) Notice: Subject to any disclaimer, the term of this patent is extended or adjusted under 35 U.S.C. 154(b) by 178 days.

(21) Appl. No.: 14/589,464

(22) Filed: Jan. 5, 2015

(51) Int. Cl.
| | |
|---|---|
| *H05K 5/00* | (2006.01) |
| *H05K 1/18* | (2006.01) |
| *H05K 5/02* | (2006.01) |
| *H05K 5/06* | (2006.01) |
| *H05K 3/30* | (2006.01) |
| *H05K 3/34* | (2006.01) |

(52) U.S. Cl.
CPC ............ *H05K 1/181* (2013.01); *H05K 3/306* (2013.01); *H05K 3/3447* (2013.01); *H05K 5/0095* (2013.01); *H05K 5/0239* (2013.01); *H05K 5/061* (2013.01); *H05K 5/069* (2013.01)

(58) Field of Classification Search
CPC ...... H05K 1/181; H05K 5/0239; H05K 5/061; H05K 3/3447; H05K 5/0095; H05K 3/306; H05K 5/069; H01L 2924/00; H01L 2224/48247; H01L 2224/32245; H01L 2224/49171; H01L 2924/15153; H01L 23/057
See application file for complete search history.

(56) References Cited

U.S. PATENT DOCUMENTS

| | | | |
|---|---|---|---|
| 5,736,783 A * | 4/1998 | Wein | H01L 21/67121 257/691 |
| 5,773,879 A * | 6/1998 | Fusayasu | H01L 23/06 257/678 |
| 6,511,866 B1 | 1/2003 | Bregante | |
| 2002/0096767 A1* | 7/2002 | Cote | H01L 23/055 257/738 |
| 2015/0103491 A1* | 4/2015 | Ma | H01L 23/13 361/715 |

* cited by examiner

*Primary Examiner* — James Wu
(74) *Attorney, Agent, or Firm* — Withrow & Terranova, P.L.L.C.

(57) ABSTRACT

Embodiments described herein relate generally to a microelectronic packaging and the manufacture thereof. A carrier may have a die attached to a top face thereof. A printed circuit board may be attached to the top face of the carrier. The printed circuit board may have a hole in which the die is disposed. A lid may be attached to the printed circuit board opposite the carrier so that the die is enclosed by the carrier, the printed circuit board, and the lid. The printed circuit board may form a seal ring around the die. Other embodiments may be described and/or claimed.

10 Claims, 4 Drawing Sheets

MODULAR SEMICONDUCTOR PACKAGE

FIELD

Embodiments of the present invention relate generally to the technical field of microelectronic packaging, and more particularly, to a package in which a die is to be enclosed.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by their inclusion in this section.

A semiconductor may be a component that may be controlled to conduct electricity under some conditions but not other conditions. Accordingly, a semiconductor may facilitate the control of an electrical current. For example, a semiconductor may be used to carry a signal in a radio-frequency device.

Often, a semiconductor may be housed in a package, which may be composed of one or more of metal, plastic, glass, and/or ceramic. The package may house a plurality of semiconductor electronic components, such as active components, passive components, a die, and the like. The package may protect the semiconductor electronic components, for example, against potentially damaging contact. Additionally, the package may prevent corrosion or other damage, for example, from moisture and/or dust.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they may mean at least one.

DETAILED DESCRIPTION

In the following detailed description, reference is made to the accompanying drawings, which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A or B" and "A and/or B" means (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the terms "module" and/or "logic" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality.

Figure 1:
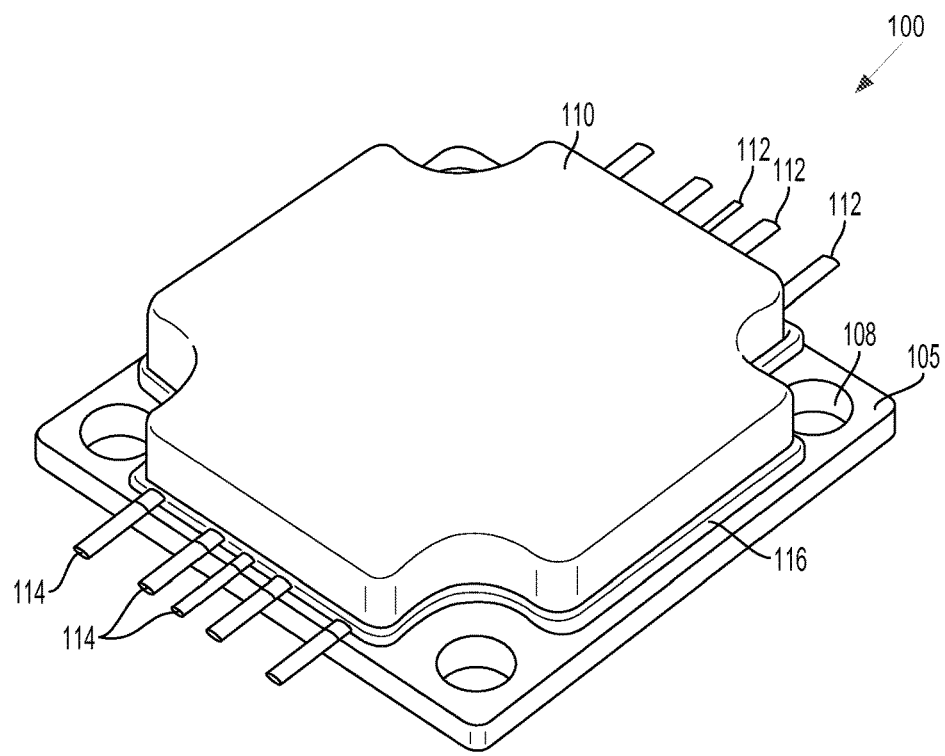
FIG. 1 illustrates a top perspective view of a modular semiconductor package, in accordance with various embodiments.

Beginning first with FIG. 1, which shows a top perspective view of a modular semiconductor package 100, in accordance with various embodiments. The modular semiconductor package 100 may include a carrier 105, a signal carrying component 116, and a lid 110.

The carrier 105, the signal carrying component 116, and the lid 110 may be separate components and, therefore, may be separately fabricated. In various embodiments, the carrier 105, the signal carrying component 116, and the lid 110 may be formed via different process steps suitable for the creation of that respective component. The carrier 105, the signal carrying component 116, and the lid 110 may be individually sourced and/or designed.

The carrier 105 may be formed from any suitable material, such as a metal, metal alloy, ceramic, or diamond. Examples of suitable materials include an electrically or thermally conductive or non-conductive material, depending upon the embodiment. In various embodiments, suitable electrically and/or thermally conductive materials may include, but are not limited to, copper, tungsten, tungsten-copper (W—Cu), or copper-molybdenum-copper (Cu—Mo—Cu). In other embodiments, the carrier 105 may be plated, such as with a conductive material (e.g., gold).

In embodiments, the carrier 105 may be sufficiently rigid so as to prevent undesired flexing of any components coupled thereto (e.g., a die, the signal carrying component 116, etc.). Additionally, the carrier 105 may include a plurality of holes 108 suitable for receiving a fastening means, such as screws or pins. The holes 108 may allow the modular semiconductor package 100 to be affixed to a host device or system, such as a radio frequency (RF) system.

The top surface of the carrier 105 may have affixed thereto at least one die (not shown). Additionally, the top surface of the carrier 105 may be coupled with the signal carrying component 116. The signal carrying component 116 may be coupled to the carrier 105 according to a variety of different approaches. For example, the signal carrying component 116 may be attached to the carrier 105 using an adhesive material (e.g., epoxy), soldering, pressure bonding, and/or temperature bonding. In some embodiments, an adhesive material used to attach the signal carrying component 116 to the carrier 105 may be conductive, such as a conductive epoxy preform.

The signal carrying component 116 may be a printed circuit board (PCB). In various embodiments, the signal carrying component 116 may be a laminate or substrate. In some embodiments, the signal carrying component 116 may be a printed wiring board, flexible circuit, dielectric (e.g., soft dielectric), or another similar component comprising conductive pathways. In some embodiments, the signal carrying component 116 may include or be coupled with a lead subassembly. In some embodiments, the lead subassembly may comprise and/or be electrically coupled with one or more traces 112, 114.

The signal carrying component 116 may be coupled with a plurality of traces 112, 114 that carry a signal through the package 100. Each of the plurality of traces 112, 114 may be a metal or metal alloy, such as copper. The plurality of traces 112, 114 may be disposed on a top surface of the signal carrying component 116 or may traverse through the signal carrying component 116. In some embodiments, one or more signals may traverse through the signal carrying component 116, such as in embodiments in which the signal carrying component 116 is a multilayer PCB.

The plurality of traces 112, 114 may be tuned, positioned, and/or of different sizes to perform different signal carrying and/or routing functions. In many embodiments, the traces 112, 114 only travel through the signal carrying component 116 and, consequently, do not travel through any of component, such as the lid 110 or the carrier 105.

The lid 110 may be formed from any suitable material. In some embodiments, the lid may be plastic, a plastic composite material, or ceramic; although embodiments in which the lid 110 is metal or metal alloy are also contemplated herein. The lid 110 may be coupled to a top surface of the signal carrying component 116 (e.g., a surface opposite the surface of the signal carrying component 116 that is coupled to the carrier 105).

The lid 110 may have a top surface supported by a plurality of walls, and the walls may be attached to the signal carrying component 116. Thus, the lid 110 may provide space above the signal carrying component 116, for example, to accommodate a lead subassembly on top of the signal carrying component 116 and/or a die having a height greater than the signal carrying component 116, while still enclosing and sealing the components (e.g., the die, lead assembly, active and/or passive components, etc.) in the package 100. In another embodiment, the lid 110 may be flat, for example, to reduce the overall height of the package 100.

The lid 110 may be coupled to the signal carrying component 116 using any suitable adhesive material, such as epoxy, resin, acrylic, and/or silicone. In embodiments, the adhesive material used to attach the lid 110 to the signal carrying component 116 may be non-conductive. In some embodiments, the lid 110 may be coupled to the signal carrying component 116 after the signal carrying component 116 is coupled to the carrier 105.

The combination of the carrier 105, the signal carrying component 116, and the lid 110 may enclose at least one die (not shown). This enclosure may seal the die therein. As part of the enclosure provided by the package 100, a seal ring may be formed, for example, to protect elements (e.g., a die, active components, and/or passive components) sealed in by the combination of the carrier 105, the signal carrying component 116, and the lid 110.

Often, a seal ring may be made into a base of a package and/or formed from one or more relatively large pieces of metal or metal alloy (e.g., stacked or layered metal components). Such a seal ring may increase a height of a package and is generally unsuitable for signal transmission. However, in various embodiments of the package 100, the signal carrying component 116 may form a seal ring, for example, around a die and/or other components.

In many packages, a seal ring is typically constrained to a lower temperature relative to other components in a package, such as a carrier and/or a die attach. Consequently, once a die is placed in a package, there may be a certain temperature that the other components cannot exceed (e.g., due to properties of materials and/or adhesion). This configuration may limit the type of die attaches that can be used in the package.

In embodiments, the modular approach to the package 100 (e.g., separately fabricated carrier 105, signal carrying component 116, and lid 110) and/or the functionality of the signal carrying component 116 as the seal ring may allow a higher temperature relative to other packages, for example, during die attach (e.g., to the carrier 105) and/or other pre-processing operations prior to attachment of the signal carrying component 116. Thus, the package 100 may be customized for individual products without substantial redesigning of the entire package 100. Accordingly, a thick film network (TFN) and/or extra wire bonds may be absent from the package 100, for example, because the die is enclosed by a customized seal ring—i.e., the signal carrying component 116—in the package 100. Therefore, dimensional tolerances, lead times, and/or costs may be reduced relative to traditional metal-ceramic packages.

Figure 2:
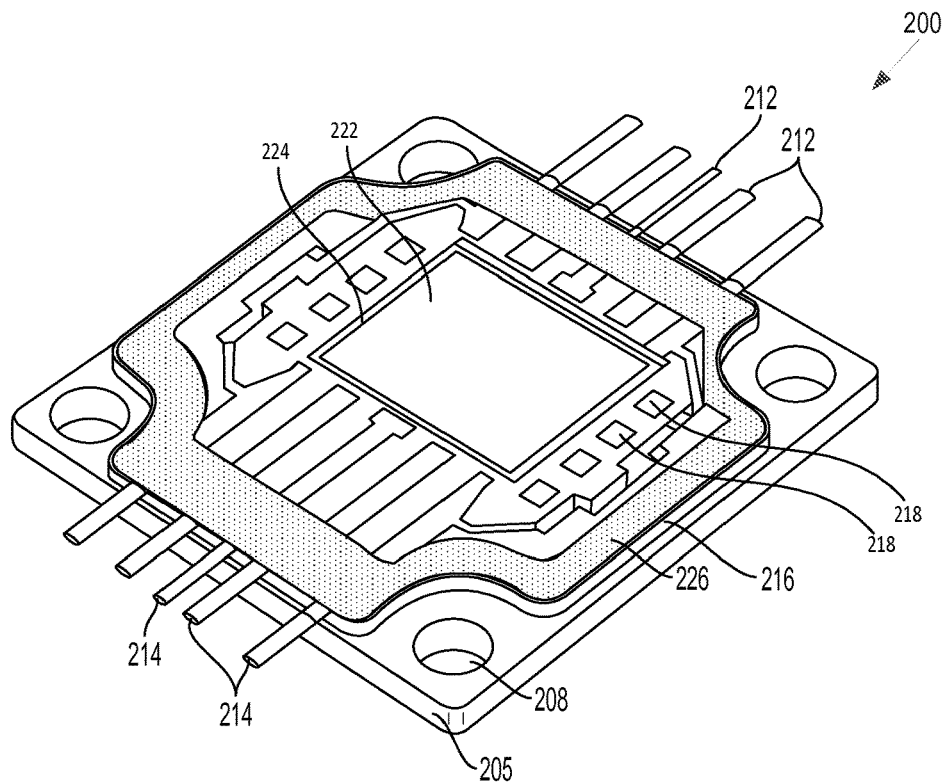
FIG. 2 illustrates a cross-sectional top perspective view of a modular semiconductor package, in accordance with various embodiments.

Turning now to FIG. 2, a cross-sectional top perspective view of a modular semiconductor package 200 is depicted. The module semiconductor package 200 may be an embodiment of the modular semiconductor package 100 of FIG. 1 and described herein and, therefore, the carrier 205 may be an embodiment of the carrier 105 and/or the signal carrying component 216 may be an embodiment of the signal carrying component 116.

As illustrated, a signal carrying component 216 may be attached to a carrier 205. The signal carrying component 216 may have an opening therethrough. When attached to the carrier 205, this opening may form a cavity 224 in which at least one die 222 as well as one or more active and/or passive components may be disposed.

In various embodiments, the signal carrying component 216 may be attached to a same surface of the carrier 205 as the die 222, but attached after the die 222 is attached to the carrier 205. The carrier 206 and the signal carrying component 216 attached thereto may seal the die 222 in the cavity 224 from the one surface (e.g., the bottom surface of the die 222).

The die 222 may be any suitable semiconducting material, such as gallium Arsenide (GaAs), gallium nitride (GAN), or another suitable semiconductor. In various embodiments, the die 22 may be attached using any suitable material, such as gold-tin (AuSn) or another alloy. The die 222 may have a functional circuit fabricated thereon.

The signal carrying component 216 may have a plurality of traces 212, 214. The traces 212, 214 may carry a signal through the package 200. The traces 212, 214 may be disposed on a surface of the signal carrying component 216 or may traverse through the signal carrying component 216. In embodiments, the plurality of traces 212, 214 may facilitate tuning of one or more signals, as the traces 212, 214. For example, the traces 212, 214 may vary in shape to facilitate different routing and/or turning functions for signal carrying. In some embodiments, one or more traces may traverse through or on top of the signal carrying component 216 and may terminate within or at the edge of the signal carrying component 216. For example, although the traces 212, 214 are illustrated as extending beyond the edge of the signal carrying component 216, embodiments are contemplated herein in which one or more traces 212, 214 do not extend beyond the edge of the signal carrying component 216.

In some embodiments, the signal carrying component 216 may have a plurality of outer pads 218. The pads 218 may be formed from any suitably conductive material, such as copper. In some embodiments, one or more of the pads 218 may be adapted to have one or more components (e.g., active and/or passive components) (not shown) attached thereto (e.g., via soldering). In some embodiments, one or more of the pads 218 may have one or more leads (not shown) attached thereto, which may form a lead subassembly.

An adhesive 226 (e.g., a nonconductive epoxy) may be applied to the signal carrying component 216 and a lid (not shown) may be attached thereto. The signal carrying component 216 and the lid attached thereto may seal the die 222 in the cavity 224 from another surface (e.g., the top surface of the die 222). The signal carrying component 216 may form a seal ring around the die 222, while also serving to carry one or more signals.

Figure 3:
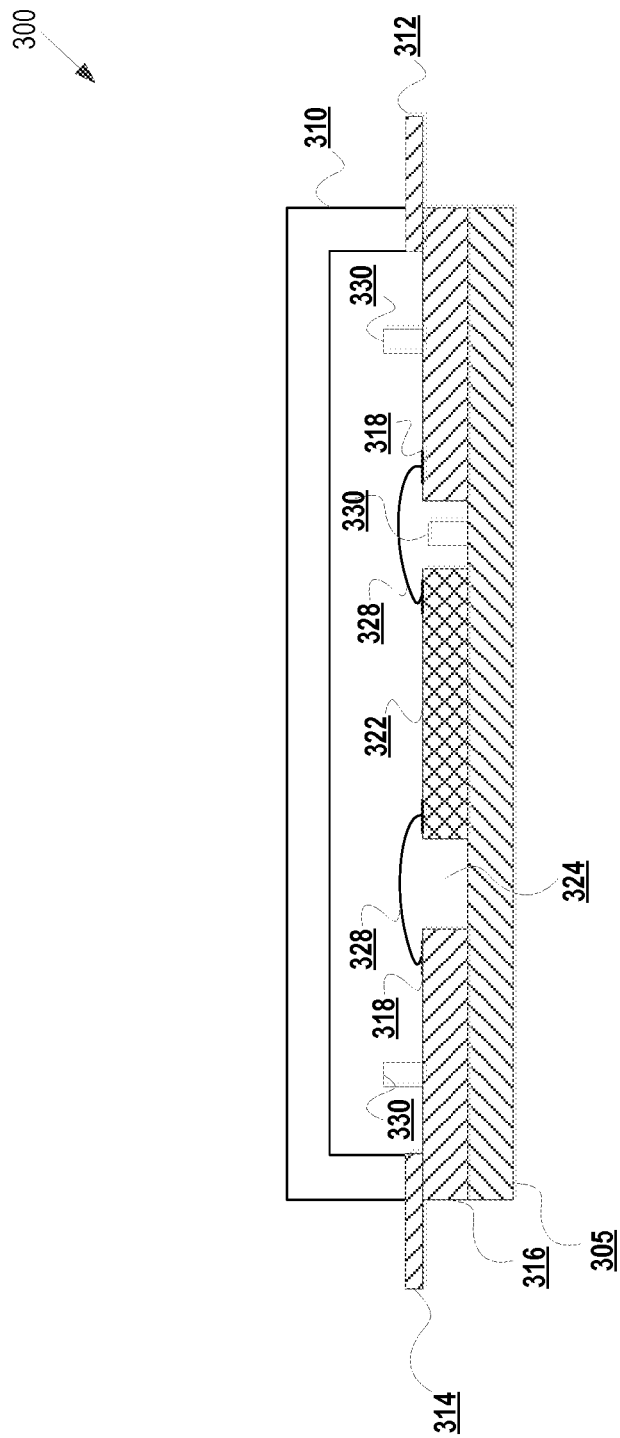
FIG. 3 illustrates a cross-sectional side view of a modular semiconductor package, in accordance with various embodiments.

With respect to FIG. 3, a cross-sectional side view of a modular semiconductor package 300 is depicted. The module semiconductor package 300 may be an embodiment of the modular semiconductor package 100 of FIG. 1 and described herein and, therefore, the carrier 305 may be an embodiment of the carrier 105, the lid 310 may be an embodiment of the lid 110, and/or the signal carrying component 316 may be an embodiment of the signal carrying component 116.

In embodiments, at least one die 322 may be disposed in a cavity formed by the attachment of a signal carrying component 316 to a carrier 305. In various embodiments, the signal carrying component 316 may be electrically coupled to the die 322 through one or more interconnects 328. The interconnects 328 may be attached to pads 318 of the signal carrying component 316, such as through conventional ribbon or wire bonding techniques.

In various embodiments, one or more components 330 may be attached directly to the carrier 305, and therefore disposed in the cavity 324, and/or attached to the signal carrying component 316. The one or more components 330 may be one or more active components (e.g., transistors, diodes, and the like) and/or passive components (e.g., resistors, capacitors, inductors, transformers, and the like). In one embodiment, one or more of the components 330 may be electrically coupled to the signal carrying component 316 via one or more of the interconnects 328.

The combination of the carrier 305, the signal carrying component 316, and the lid 310 may enclose die 322 and the one or more components 330. This enclosure may seal the die 322 and the one or more components 330 therein. As part of the enclosure provided by the package 300, a seal ring may be formed by the signal carrying component 316. The signal carrying component 316 may additionally carry one or more signals, such as through traces 312, 314.

Figure 4:
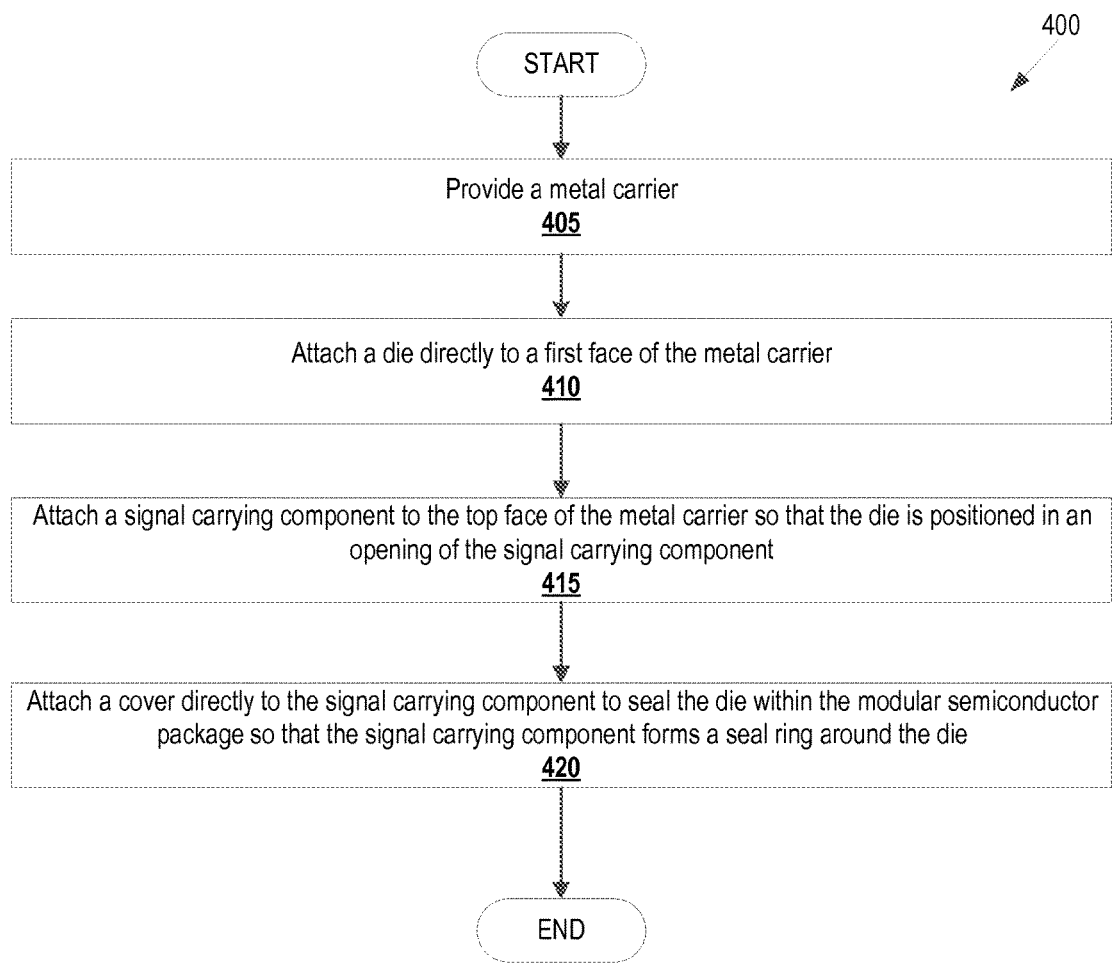
FIG. 4 is a flow diagram illustrating a method for manufacturing a modular semiconductor package, in accordance with various embodiments.

With reference to FIG. 4, a method 400 for manufacturing a modular semiconductor package is illustrated. While the method 400 illustrates a plurality of sequential operations, embodiments are contemplated in which one or more operations are transposed and/or contemporaneously performed.

Beginning first with operation 405, the method 400 may include providing a metal carrier. The metal carrier may have a plurality of faces or surfaces, such as a "top" surface and a "bottom" surface, depending upon perspective and/or intended use of the modular semiconductor package. Operation 410 may include attaching a die directly to a first face of the metal carrier. The attachment of the die to the metal carrier may be accomplished through any suitable approach, such as through the use of adhesive, soldering, bonding, and the like. The attachment of the die to the metal carrier may be performed in accordance with some predefined measurements so that additional components may be attached to the carrier in a suitable way, for example, without contacting the die.

The die may have a plurality of faces or surfaces, such as a "top" surface and a "bottom" surface. In embodiments, the top surface of the die may have a functional circuit fabricated thereon. The bottom surface of the die may be attached to the carrier.

In some embodiments, additional operations may be performed associated with pre-processing. In various embodiments, operation 410 and/or additional pre-processing operations may be performed in connection with a relatively high temperature that may be unsuitable for other components (e.g., a printed circuit board, active components, leads, etc.). Therefore, operation 410 and/or additional pre-processing operations may be performed before proceeding to additional operations of the method 400.

At operation 415, the method 400 may include attaching a signal carrying component to the top face of the metal carrier. The signal carrying component may be attached directly to the carrier. In one embodiment, the signal carrying component may be attached using a conductive epoxy. In other embodiments, the signal carrying component may be attached using soldering or bonding (e.g., pressure and/or temperature bonding). The signal carrying component may include a "top" face and a "bottom" face (e.g., one or more pads and/or one or more traces may be disposed on a top face of the signal carrying component), and the bottom face may be attached to the top face the metal carrier.

The signal carrying component may have an opening that is dimensionally larger than the die. The signal carrying component may be attached so that the die is positioned in the opening. In some embodiments, the signal carrying component may be attached so that the signal carrying component does not contact the die (although the signal carrying component may be electrically coupled to the die).

Although operation 415 is illustrated as following operation 410, embodiments are contemplated wherein the die is attached to the carrier after the signal carrying component is attached to the carrier.

In some embodiments, operation 415 may comprise operations associated with attaching one or more leads to the signal carrying component. For example, one or more leads may be soldered to one or more pads disposed on the signal carrying component. In some embodiments, one or more interconnects may also be attached to the die to electrically couple the die and the signal carrying component.

In some embodiments, the method 400 may include operations (not shown) associated with attaching one or more components (e.g., active and/or passive components) to the carrier and/or the signal carrying component. For example, one or more components may be attached to the top face of the signal carrying component and/or one or more components may be attached to the top face of the metal carrier and positioned in the opening of the signal carrying component. In some embodiments, one or more components may be electrically coupled to the signal carrying component through one or more leads.

To seal the modular semiconductor package, operation 420 may include attaching a cover to the signal carrying component. In embodiments, the covered may be directly attached to the top face of the signal carrying component. According to various embodiments, the cover may be attached to the signal carrying component using a nonconductive epoxy. The attachment of the cover may cover the opening in the signal carrying component and may seal the package in which the die (and, optionally, the leads and/or other components) are disposed. Correspondingly, the signal carrying component may form a seal ring around the die.

Embodiments illustrated herein depict a single die. However, one of ordinary skill would recognize that packages in accordance with various embodiments may be implemented with multiple die without departing from the scope of the present disclosure.

Figure 5:
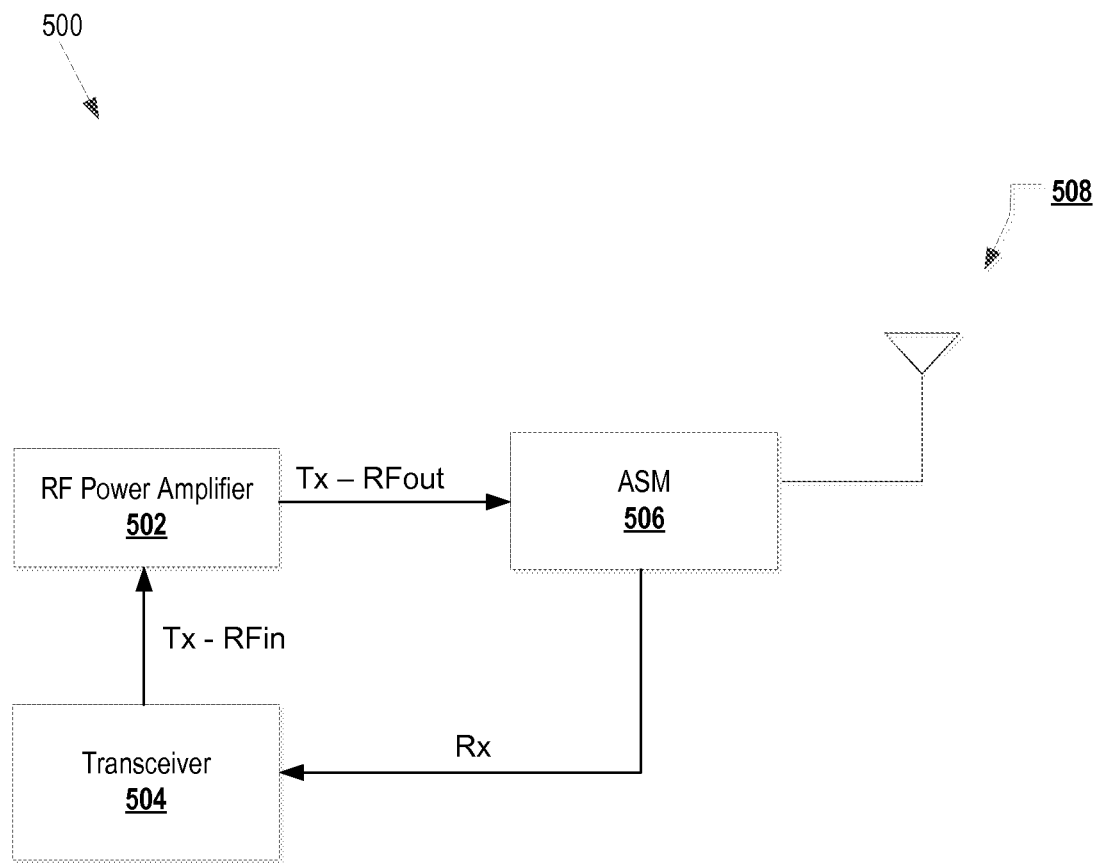
FIG. 5 is a block diagram illustrating a system that may include a modular semiconductor package, in accordance with various embodiments.

Embodiments of packages described herein may be incorporated into various apparatuses and systems. A block diagram of an exemplary system 500 is illustrated in FIG. 5. As illustrated, the system 500 includes an RF power amplifier 502 including a package in accordance with various embodiments of the present invention. The system 500 may include a transceiver 504 coupled with the RF power amplifier 502 as shown.

The RF power amplifier 502 may receive an RF input signal, RFin, from the transceiver 504. The RF power amplifier 502 may amplify the RF input signal, RFin, to provide the RF output signal, RFout. The RFinput signal, RFin, and the RF output signal, RFout, may both be part of a transmit chain, respectively noted by Tx-RFin and Tx-RFout in FIG. 5.

The amplified RF output signal, RFout, may be provided to an antenna switch module (ASM) 506, which effectuates an over the air (OTA) transmission of the RF output signal, RFout, via an antenna structure 508. The ASM 506 may also receive RF signals via the antenna structure 508 and couple the received RF signals, Rx, to the transceiver 504 along a receive chain.

In various embodiments, the antenna structure 508 may include one or more directional and/or omnidirectional antennas, including, e.g., a dipole antenna, a monopole antenna, a patch antenna, a loop antenna, a microstrip antenna, or any other type of antenna suitable for OTA transmission/reception of RF signals.

The system 500 may be a system including power amplification. In various embodiments, the system 500 may be particularly useful for power amplification at high radio frequency power and frequency. For example, the system 500 may be suitable for any one or more of terrestrial and satellite communications, radar systems, electronic warfare systems, and possibly in various industrial and medical applications. Radar applications may include military-use radar, air traffic control, navigation, and the like.

The listed applications for the system 500 is intended to be illustrative and not exhaustive. The system 500 may find applicability in other systems and applications.

What is claimed is:

1. A semiconductor package comprising:
   a carrier having a top surface, wherein the top surface of the carrier is planar;
   a die attached directly to the top surface of the carrier;
   a signal carrying component capable of transmitting signals, the signal carrying component having a top surface, a bottom surface attached to the top surface of the carrier, and an opening disposed around the die, wherein the signal carrying component is electrically coupled to the die through one or more interconnects;
   at least one first component, wherein:
      the at least one first component is at least one of a group consisting of transistors, diodes, resistors, capacitors, inductors, and transformers; and
      the at least one first component is at least partially disposed in the opening and attached directly to the top surface of the carrier; and
   a lid attached to the top surface of the signal carrying component such that the carrier, the signal carrying component, and the lid enclose the die and the at least one first component;
   wherein the signal carrying component comprises a printed circuit board; and
   wherein the lid is plastic or ceramic and the carrier is metal.

2. The semiconductor package of claim 1, wherein the signal carrying component is separately created from the carrier, lid, and the die.

3. The semiconductor package of claim 1, further comprising:
   a plurality of leads attached to the signal carrying component.

4. The semiconductor package of claim 3, wherein the signal carrying component includes a plurality of pads disposed thereon, and at least one of the leads is soldered to at least one of the pads.

5. The semiconductor package of claim 1, wherein the signal carrying component is attached to the carrier with a conductive epoxy.

6. The semiconductor package of claim 1, wherein the lid is attached to the signal carrying component with nonconductive epoxy.

7. The semiconductor package of claim 1, wherein the metal carrier, the signal carrying component, the die, and the lid are separate components.

8. The semiconductor package of claim 1, wherein signal traces are on top of the signal carrying component or through the signal carrying component.

9. The semiconductor package of claim 1 further comprising at least one second component directly attached to the top surface of the signal carrying component.

10. The semiconductor package of claim 9, wherein the at least one second component is at least one of a group consisting of transistors, diodes, resistors, capacitors, inductors, and transformers.

* * * * *